United States Patent [19]

Addis et al.

[11] 4,132,958

[45] Jan. 2, 1979

[54] FEEDBESIDE CORRECTION CIRCUIT FOR AN AMPLIFIER

[75] Inventors: John L. Addis, Portland; Bruce E. Hofer, Beaverton, both of Oreg.

[73] Assignee: Tektronix, Inc., Beaverton, Oreg.

[21] Appl. No.: 846,744

[22] Filed: Oct. 31, 1977

[51] Int. Cl.² .............................................. H03F 3/45
[52] U.S. Cl. .................................... 330/252; 330/126;
 330/149; 330/151; 330/306
[58] Field of Search ............... 330/126, 149, 151, 252, 330/306

[56] References Cited

U.S. PATENT DOCUMENTS

| | | | |
|---|---|---|---|
| 2,589,133 | 3/1952 | Purington | 330/126 |
| 2,737,628 | 3/1956 | Haines | 330/126 X |
| 3,460,051 | 8/1969 | Bray | 330/151 |
| 3,611,145 | 10/1971 | O'Connor | 330/149 |
| 3,709,206 | 5/1973 | Ferguson | 330/126 X |
| 3,727,147 | 4/1973 | DeWitt | 330/126 X |
| 3,944,944 | 3/1976 | Ellenbecker | 330/149 |

OTHER PUBLICATIONS

Trapnell et al., "Wideband Amplifier," *IBM Technical Disclosure Bulletin,* vol. 2, No. 5, Feb. 1960, p. 40.

*Primary Examiner*—James B. Mullins
*Attorney, Agent, or Firm*—George T. Noe

[57] ABSTRACT

A feedbeside correction circuit for correcting errors in the frequency response of a wideband amplifier includes a network which models the physical distortion-producing mechanisms of the amplifier semiconductor pn junctions. An input signal is applied simultaneously to the amplifier and to the feedbeside circuit. The feedbeside circuit produces a correction signal which is applied to a summing node and subtracted from the amplifier signal so that the amplifier output is substantially error free. The circuit may be used both for single-ended and differential inputs.

6 Claims, 4 Drawing Figures

FIG 3

FEEDBESIDE CORRECTION CIRCUIT FOR AN AMPLIFIER

BACKGROUND OF THE INVENTION

In wideband amplifiers, it is desirable to maintain a constant gain-versus-frequency characteristic over the entire frequency spectrum. However, because of inherent physical limitations of semiconductor devices which may result in nonlinear distortion, thermal distortion, frequency distortion, or phase-shift distortion, amplifier fidelity is difficult to maintain over a wide range of frequencies without relying upon various frequency-compensation and transient-response-peaking techniques.

Wideband differential amplifiers such as those utilized in the vertical amplifier channels of oscilloscopes exhibit a large gain at the lower frequencies and a reduced gain at the higher frequencies. Heretofore, the approach to providing a constant gain over the entire amplifier bandwidth has been to boost the high-frequency gain by adding resistive-capacitive networks between the emitters of the differentially-coupled transistors of the amplifier. However, at very high frequencies, for example, above 500 megahertz, the inductive properties of the lead wires of the amplifier components become an undesirable factor in determining the frequency response. The circuit designer is thus faced with the dichotomous dilemma of reducing lead length and adding components to effect the required high-frequency boost.

SUMMARY OF THE INVENTION

In accordance with the present invention, a feedbeside correction circuit is provided for correcting errors in the frequency response of an amplifier. The feedbeside circuit is disposed in parallel with distortion-producing portions of the amplifier, and includes a network to model the physical mechanisms which produce the distortion. A correction signal is generated thereby and applied to an amplifier summing node to be subtracted from the amplifier signal so that the amplifier output is substantially error free.

In a wideband differential amplifier, a feedbeside circuit is provided to solve the problem described hereinabove with regard to amplifier gain being larger at the lower frequencies and smaller at the higher frequencies by taking the approach that the gain at the lower frequencies is excessive. Therefore, the feedbeside circuit is provided to correct low-frequency errors in the frequency response of the amplifier so that the gain thereof is substantially constant over the frequency range. The feedbeside circuit receives the amplifier input signal and develops therefrom a correction signal which is injected into the amplifier to correct the error. The feedbeside circuit includes one or more adjustable low-pass filter networks to shape the signal and provide a correction signal therefrom within a predetermined range of frequencies which may be referred to as a correction band. Outside the correction band, that is, at higher frequencies, the feedbeside circuit is not effective, and therefore there are no high frequency performance requirements upon the feedbeside circuitry. No nonlinearities are introduced by the feedbeside circuit. Other amplifier design techniques, e.g., high-frequency peaking to optimize transient response, are compatible with the feedbeside correction technique. Both single-ended signal and differential signal embodiments are included.

It is therefore one object of the present invention to provide a novel circuit for correcting errors in the frequency response of an amplifier.

It is another object to provide a distortion correction circuit by modeling the distortion-producing mechanisms of a transistor amplifier and producing a correction signal to be subtracted from the amplifier signal.

It is a further object to provide a substantially constant gain in a wideband differential amplifier by correcting low-frequency errors.

It is an additional object to provide a feedbeside amplifier correction technique which is compatible with other design techniques.

Other objects and advantages of the present invention will become apparent to those having ordinary skill in the art when taken in conjunction with the accompanying drawings.

DETAILED DESCRIPTION

Figure 1:
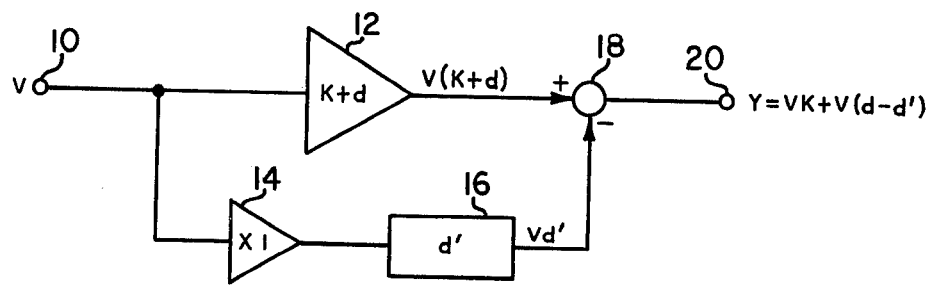
FIG. 1 is a block diagram of a feedbeside correction circuit for an amplifier.

Referring to the block diagram of FIG. 1, an input signal V is applied via an input terminal 10 to an amplifier 12. Amplifier 12 has a gain factor K which is modified by a certain amount of distortion d inherent in the amplifier, so that the transfer function thereof is $V(K+d)$. There are many types of amplifier distortion, including nonlinearity, thermal distortion, frequency distortion, and phase-shift distortion. The distortion-producing mechanisms are well known in the art, and thus may be modeled by means of a suitable network which has a distortion factor $d'$. The input signal V is fed through a buffer amplifier 14 to such a distortion-modeling network 16 to produce a correction signal $Vd'$. The correction signal and amplifier signal are algebraically summed at a summing node 18 with the correction signal $Vd'$ being subtracted from the amplifier signal $V(K+d)$. Thus the output signal at output terminal 20 is $Y=VK+V(d-d')$. If the distortion-producing mechanism is modeled properly, the second term on the right-hand side of the equation is reduced to zero, leaving only the amplified signal term.

Figure 2:
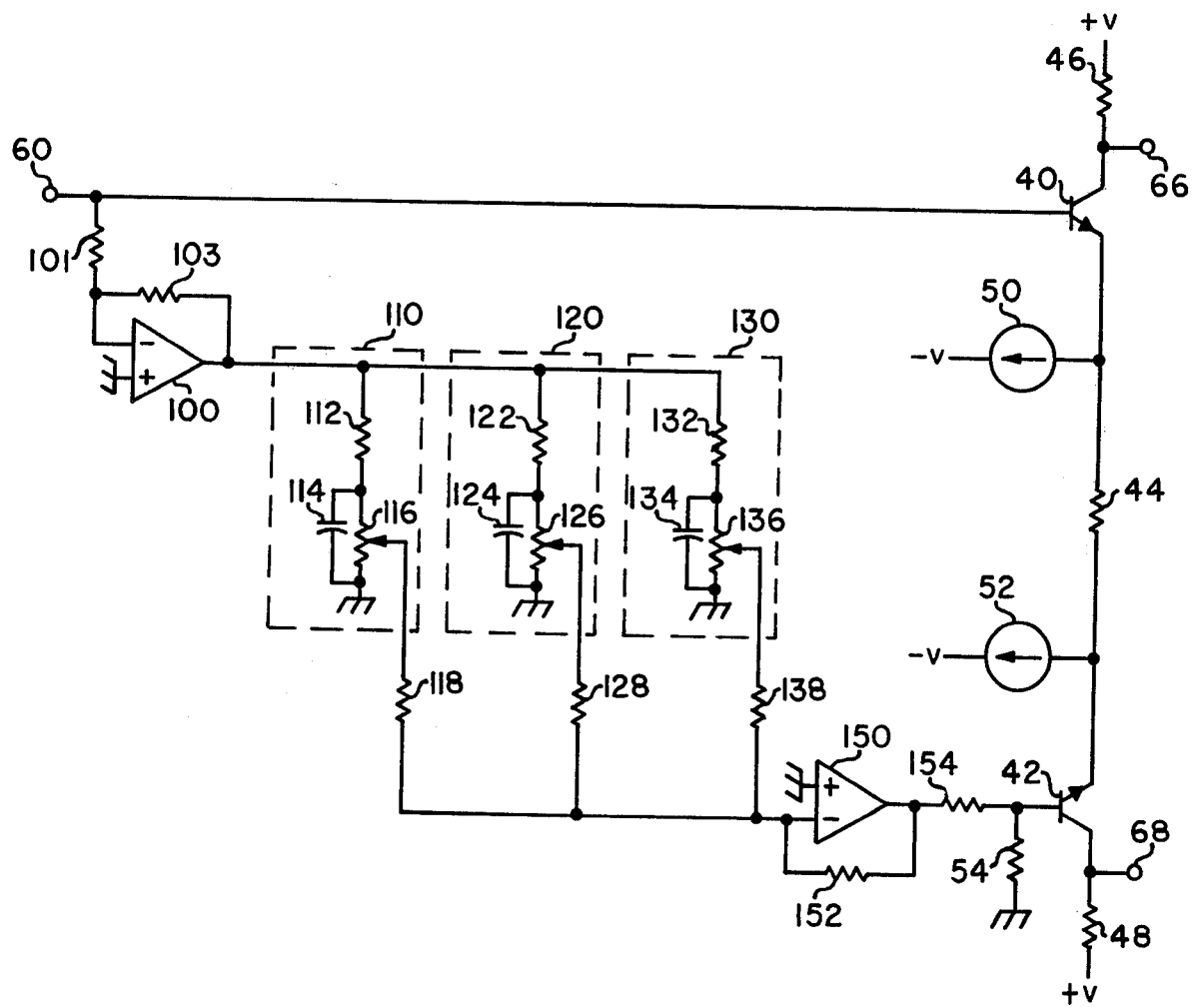
FIG. 2 is a schematic diagram of a feedback circuit for a single-ended input in accordance with the present invention.

FIG. 2 is a schematic of a wideband differential amplifier having a feedbeside correction path to correct low-frequency errors in the frequency response of the amplifier so that the gain thereof is substantially constant over the frequency range. A conventional wideband differential amplifier having a single-ended input and a push-pull output includes a pair of transistors 40 and 42, the emitters of which are coupled together through a resistor 44. The collectors of transistors 40 and 42 are connected to a suitable source of positive voltage $+V$ through collector-load resistors 46 and 48 respectively, while the emitters thereof are connected to a suitable source of negative voltage $-V$ through current sinks 50 and 52 respectively. The base of transistor 42 is connected to ground through a resistor 54 to establish the amplifier input reference voltage. The input signal is applied via an input terminal 60 to the base of transistor 40. The signal voltage is developed across resistor 44, producing signal current through transistors 40 and 42 to produce a push-pull output signal across resistors 46 and 48. This output signal is available at output terminals 66 and 68.

The feedbeside correction circuit is connected between the input terminal 60 and the base of transistor 42. The input signal is first amplified to a suitable level by operational amplifier 100 and its associated resistors 101 and 103. Connected to the output of amplifier 100 is a low-pass filter network including adjustable filters 110, 120, and 130. Each filter is identical except for component values, which are chosen so that each filter has a predetermined frequency range through which signals can pass without loss. For example, filter 110 may pass signals in the frequency range from $f_0$ to $f_1$, filter 120 may pass signals in the frequency range from $f_1$ to $f_2$, and filter 130 may pass signals in the frequency range from $f_2$ to $f_3$. Thus a correction band $f_0$-$f_3$ may be established. It should be pointed out that for low frequency correction, it may be advantageous to establish the lower bandwidth limit of each filter at DC and the respective upper limits at $f_1$, $f_2$, and $f_3$ because the voltages developed across the operational amplifier input resistors 118, 128, and 138 are summed. While three filters are shown, any number of filters may be provided depending upon the correction band desired. A proposed commercial embodiment has been built and tested which employs four filter networks, each having a range from DC to a higher frequency, to produce a correction band from DC to about two megahertz to reduce excessive low-frequency gain in a wideband amplifier.

The filtered signal is inverted and amplified by operational amplifier 150 and its associated feedback resistor 152, and then attenuated by resistors 154 and 54 to produce a correction signal of the correct proportion at the base of transistor 42. Since the correction signal is applied in common mode with the input signal, the excessive amplitude is cancelled within the correction band of frequencies. At the higher frequencies, that is, above the DC to 2 MHz correction band, the wideband amplifier operates as desired and the feedbeside circuit has no effect. No nonlinearities are introduced by the feedbeside circuit, and, additionally, other amplifier design techniques such as signal peaking may be employed to optimize performance.

Figure 3:
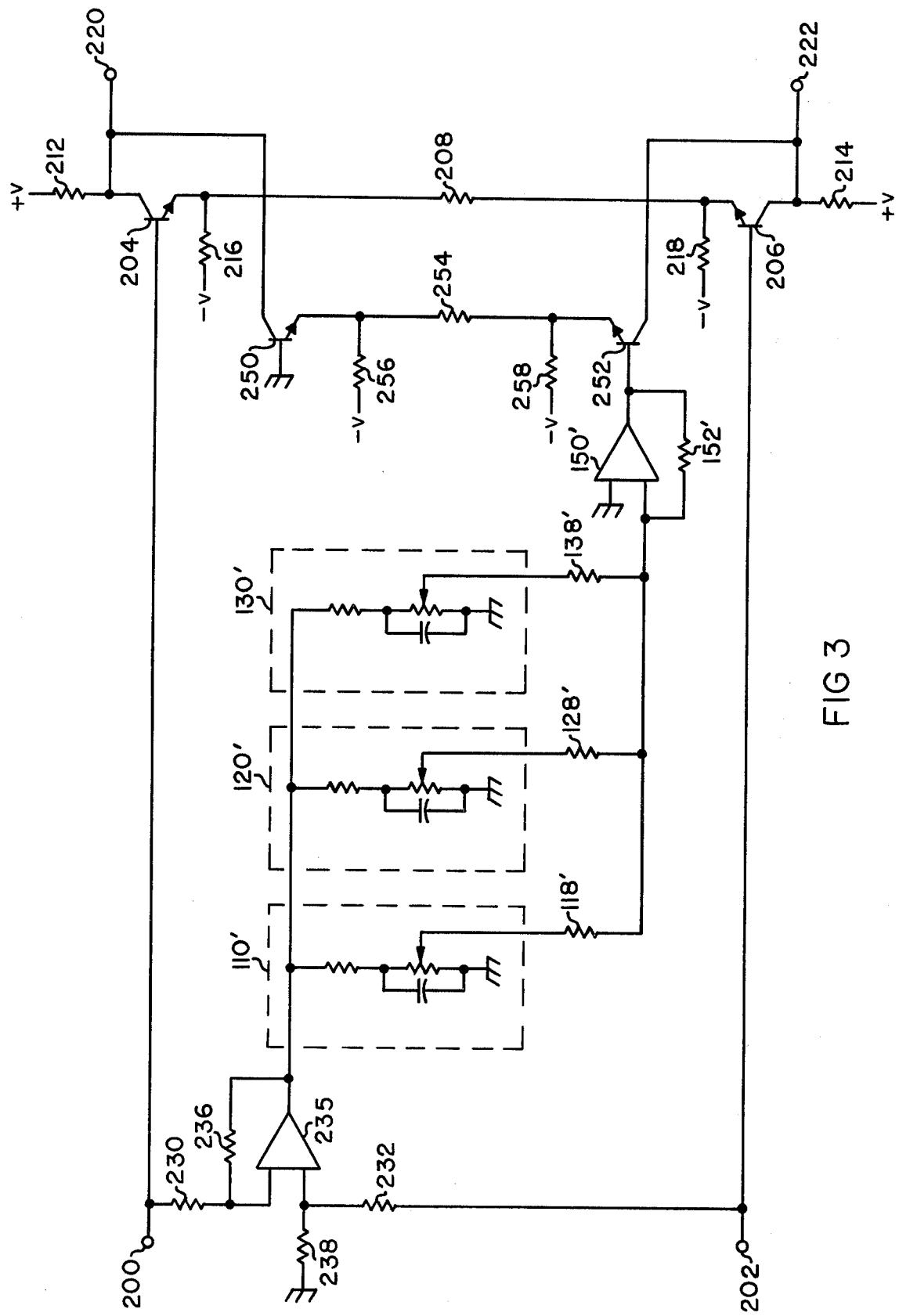
FIG. 3 is a schematic diagram of a feedbeside circuit for a differential input in accordance with the present invention.
Figure 4:
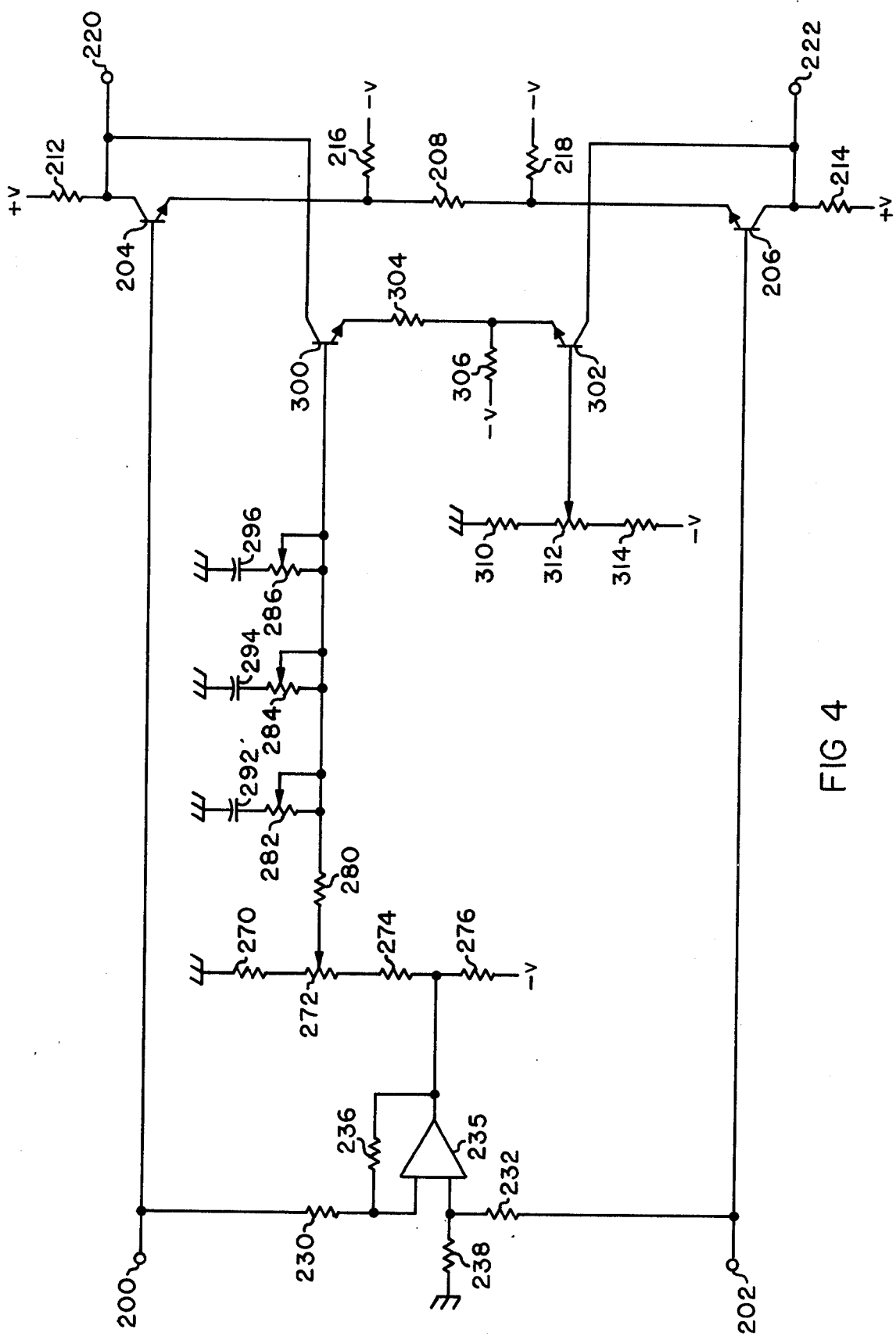
FIG. 4 is a schematic diagram of an alternative differential input embodiment.

FIGS. 3 and 4 show feedbeside circuit arrangements for amplifiers having differential signal inputs. Like circuit components have like reference numerals. A differential input signal is applied via input terminals 200 and 201 to the bases of a pair of transistors 204 and 206, the emitters of which are coupled together through an emitter resistor 208. The collectors of transistors 204 and 206 are connected to a suitable source of positive voltage $+V$ through collector-load resistors 212 and 214 respectively, while the emitters thereof are connected to a suitable source of negative voltage $-V$ through emitters 216 and 218 respectively. A push-pull output signal is developed at the collectors of transistors 204 and 206, and is available at output terminals 220 and 222.

The differential input signals are picked off and applied via resistors 230 and 232 to operational amplifier 235. Resistor 236 is the operational amplifier feedback resistors, while resistor 238 forms a voltage divider with resistor 232.

In FIG. 3, the operational amplifier output is applied to a filter network 110'-120'-130' and operational amplifier 150', which are substantially identical to those described hereinabove in connection with FIG. 2. The correction signal produced at the output of amplifier 150' is converted to a push-pull signal by a differential correction-signal amplifier comprising transistors 250 and 252, whose emitters are coupled together through an emitter resistor 254. The collectors of transistors 250 and 252 are connected to the collectors of transistors 204 and 206 respectively, while the emitters of transistors 250 and 252 are connected to the negative supply $-V$ through emitter resistors 256 and 258 respectively. The base of transistor 250 is connected to a reference voltage, such as ground, while the correction signal is applied to the base of transistor 252. Because of two polarity inversions in the feedbeside circuit, the correction signal at the base of transistor 252 is in phase with amplifier input signal component at the base of transistor 204, and 180 degrees out of phase with the amplifer signal component at the base of transistor 206. Therefore, the differential correction signal at the collectors of transistors 250 and 252 is of opposite polarity from the differential signal at the collectors of transistors 204 and 206 respectively, and hence the correction signal is subtracted from the amplifier signal to produce an error-free output terminals 220 and 222.

In FIG. 4, the output of operational amplifier 235 is applied to a filter network comprising an adjustable voltage divider, which is made up of resistors 270, 272, 274, and 276 connected between ground and the negative supply $-V$, resistors 280, 282, 284, and 286, and capacitors 292, 294, and 296. The correction signal produced at the output of the filter network is converted to a push-pull signal by a differential correction-signal amplifier comprising transistors 300 and 302, whose emitters are coupled together through a resistor 304 and to the negative supply $-V$ through a resistor 306. The collectors of transistors 300 and 302 are connected to the collectors of transistors 204 and 206 respectively to subtract the correction signal from the amplifier signal and thereby produce a substantially error-free output at the output terminals 220 and 222. A voltage divider comprising resistors 310, 312, and 314 is connected to the base of transistor 302 to effect a balance adjustment of the correction signal amplifier.

It should be pointed out that the wideband differential amplifiers discussed in connection with the hereinabove described embodiments are of simple construction to aid in understanding the feedbeside circuit concepts. In actual practice, high-frequency multi-stage cascode amplifiers, such as that taught in U.S. Pat. No. 3,633,120 to Carl R. Battjes, may be utilized.

It will be obvious to those skilled in the art that the feedbeside correction techniques described hereinabove may be implemented in many ways, and that many changes may be made in the details of the hereinabove described embodiments. The appended claims therefore cover all such changes and modifications as fall therewithin.

What we claim as being novel is:

1. An amplifier having a correction circuit, comprising:

input terminal means for receiving an input signal;

a first wideband differential amplifier coupled to said input terminal means to receive said input signal and produce an output signal therefrom, said first differential amplifier including a first pair of emitter coupled transistors having a pair of output collectors;

correction circuit means coupled to said input terminal means, said correction circuit means being responsive to said input signal for generating a correction signal only when the frequency of said input signal is within a predetermined frequency band;

a second differential amplifier coupled to said correction circuit means, said second differential amplifier including a second pair of emitter coupled transistors having a pair of output collectors; and means for coupling both collectors of said second pair of emitter coupled transistors to both collectors of said first pair of emitter coupled transistors so that said correction signal is algebraically summed with said output signal.

2. An amplifier in accordance with claim 1 wherein said correction circuit means includes a buffer amplifier input stage, said buffer amplifier comprising an operational amplifier having a predetermined gain characteristic.

3. An amplifier in accordance with claim 2 wherein said operational amplifier is adapted to receive a differential input.

4. An amplifier in accordance with claim 1 wherein said correction circuit means includes a plurality of low pass filters for passing a signal therethrough within a predetermined correction frequency band.

5. An amplifier in accordance with claim 4 wherein said correction circuit means further includes a plurality of adjustable voltage dividers connected to said low pass filters for adjusting the attenuation of signal levels through each of said filters.

6. An amplifier in accordance with claim 4 wherein said correction circuit means further includes an operational amplifier output stage, said operational amplifier having a plurality of input resistors each of which is connected to a low pass filter.

* * * * *